US009362565B2

(12) United States Patent
Wei et al.

(10) Patent No.: US 9,362,565 B2
(45) Date of Patent: Jun. 7, 2016

(54) APPARATUS AND ASSOCIATED METHODS

(75) Inventors: Di Wei, Cambridge (GB); Darryl Cotton, St. Ives (GB); Piers Andrew, Cambridge (GB); Teuvo Tapani Ryhanen, Helsinki (FI)

(73) Assignee: Nokia Technologies Oy, Espoo (FI)

( * ) Notice: Subject to any disclaimer, the term of this patent is extended or adjusted under 35 U.S.C. 154(b) by 504 days.

(21) Appl. No.: 13/439,334

(22) Filed: Apr. 4, 2012

(65) Prior Publication Data

US 2013/0265003 A1    Oct. 10, 2013

(51) Int. Cl.
| | |
|---|---|
| *H01M 16/00* | (2006.01) |
| *H01M 4/60* | (2006.01) |
| *H01G 11/28* | (2013.01) |
| *H01G 11/48* | (2013.01) |
| *H01G 11/70* | (2013.01) |
| *H01L 41/113* | (2006.01) |
| *H01G 11/04* | (2013.01) |

(52) U.S. Cl.
CPC ............. *H01M 4/602* (2013.01); *H01G 11/28* (2013.01); *H01G 11/48* (2013.01); *H01G 11/70* (2013.01); *H01L 41/113* (2013.01); *H01G 11/04* (2013.01); *H01M 16/00* (2013.01); *Y02E 60/13* (2013.01)

(58) Field of Classification Search
None
See application file for complete search history.

(56) References Cited

U.S. PATENT DOCUMENTS

| 5,976,284 A * | 11/1999 | Calvert ............... G02F 1/13439 156/51 |
| 6,565,763 B1 | 5/2003 | Asakawa et al. ................. 216/56 |
| 6,768,246 B2 | 7/2004 | Pelrine et al. ................. 310/339 |
| 2002/0009649 A1 | 1/2002 | Sato et al. ...................... 429/306 |
| 2002/0155327 A1* | 10/2002 | Faris .................... H01M 6/5005 429/9 |
| 2005/0155215 A1* | 7/2005 | Yoshino ................ H01M 2/361 29/623.1 |
| 2006/0008696 A1 | 1/2006 | Cha et al. ........................ 429/38 |
| 2008/0138704 A1* | 6/2008 | Mizuta ................... H01G 9/035 429/203 |
| 2009/0026513 A1* | 1/2009 | Johansson ............. C08F 214/22 257/295 |
| 2009/0311587 A1 | 12/2009 | Best et al. ..................... 429/127 |
| 2010/0118243 A1* | 5/2010 | Majumdar .......... H01L 51/0021 349/122 |
| 2010/0175354 A1 | 7/2010 | Mizukami et al. ............... 55/528 |
| 2011/0027648 A1 | 2/2011 | Rolison et al. ................. 429/209 |
| 2011/0059362 A1 | 3/2011 | West et al. ..................... 429/219 |
| 2011/0097624 A1* | 4/2011 | Bhatt ..................... H01G 9/042 429/163 |
| 2011/0171518 A1 | 7/2011 | Dunn et al. .................... 429/163 |

(Continued)

FOREIGN PATENT DOCUMENTS

| CN | 102354619 A | 2/2012 |
| EP | 0239846 A1 | 10/1987 |

(Continued)

OTHER PUBLICATIONS

Hu, Liangbing., et al., "Symmetrical MnO2-Carbon Nanotube-Textile Nanostructures for Wearable Pseudocapacitors with High Mass Loading", ACS Nano, 5,No. 11, 8904, 2011, 10 pgs.

(Continued)

*Primary Examiner* — Patrick Ryan
*Assistant Examiner* — Jose Colucci Rios
(74) *Attorney, Agent, or Firm* — Harrington & Smith

(57) ABSTRACT

An apparatus including a flexible substrate of electrically insulating material, and an electrically conductive polymer, wherein the electrically conductive polymer is retained by the flexible substrate to form together at least part of an electrode of an electrical storage apparatus such that the electrically conductive polymer provides an electrical path for electrons which are generated and/or stored by the electrical storage apparatus.

18 Claims, 11 Drawing Sheets

(56) References Cited

U.S. PATENT DOCUMENTS

| | | | |
|---|---|---|---|
| 2011/0183180 A1 | 7/2011 | Yu et al. | 429/128 |
| 2011/0212545 A1* | 9/2011 | Leenders | H01L 27/101 |
| | | | 438/3 |
| 2011/0227059 A1 | 9/2011 | Kim et al. | 257/43 |
| 2011/0272028 A1 | 11/2011 | Yun et al. | 136/263 |
| 2012/0100422 A1 | 4/2012 | Moriguchi et al. | 429/188 |

FOREIGN PATENT DOCUMENTS

| | | |
|---|---|---|
| JP | 2001-151834 A | 6/2001 |
| JP | 2010-225432 A | 10/2010 |
| KR | 2012-0001456 A | 1/2012 |
| WO | WO 2007/059589 A1 | 5/2007 |
| WO | WO-2010/150857 A1 | 12/2010 |
| WO | WO-2011/014312 A | 2/2011 |

OTHER PUBLICATIONS

Pelrine, Ron, et al., "Dielectric Elastomers: Generator Mode Fundamentals and Applications", © 2001 SPIE, 9 pgs.

Hu, Liangbing, et al., "Stretchable, Porous, and Conductive Energy Textiles", © 2010 American Chemical Society, 7 pgs.

Kaltseis, Rainer, et al., "Method for Measuring Energy Generation and Efficiency of Dielectric Elastomer Generators", © 2011 American Institute of Physics, 3 pgs.

Yu, et al., "Solution-Processed Graphene/MnO2 Nanostructured Textiles for High-Performance Electrochemical Capacitors", American Chemical Society, (2011), (pp. 2905-2911).

Shim, et al., "Smart Electronic Yarns and Wearable Fabrics for Human Biomonitoring Made by Carbon Nanotube Coating with Polyelectrolytes", American Chemical Society, (2008), (pp. 4151-4157).

Choi, et al., "Fully Rollable Transparent Nanogenerators Based on Graphene Electrodes", Wiley Inter Science, (2010), (pp. 2187-2192).

Czech, et al., "Energy Harvesting Using Dielectric Elastomers", (2010), (6 pages).

Graf, et al., "Multilevel High Voltage Converter Driving Dielectric Elastomer Generators", (2011), (10 pages).

Kil, et al., "A Facile Approach to Fabricate Self-Standing Gel-Polymer Electrolytes for Flexible Lithium-Ion Batteries by Exploitation of UV-Cured Trivalent/Monovalent Acrylate Polymer Matrices", Macromolecular Chemistry and Physics, (2011), (pp. 2217-2223).

Novak, et al., "Electrochemically Active Polymers for Rechargeable Batteries", (1997), (pp. 207-281).

Yao et al., "Long cycle-life LiFePO4/Cu-Sn lithium ion battery using foam-type three-dimensional current collector", Journal of Power Sources 195, 2010, pp. 2077-2081.

E. Crossland et al., "A Bicontinuous Double Gyroid Hybrid Solar Cell", 2009, American Chemical Society, whole document (17 pages).

J. Long et al., "Three-Dimensional Battery Architectures", 2004, American Chemical Society, whole document (30 pages).

F. Bates et al., "Polymeric Bicontinuous Microemulsions", 1997, The American Physical Society, whole document (4 pages).

S. Cheah et at., "Self-Supported Three-Dimensional Nanoelectrodes for Microbattery Applications", 2009, American Chemical Society, whole document (4 pages).

V. Pushparaj et al. "Flexible Energy Storage Devices Based on Nanocomposite Paper", PNAD, Aug. 21, 2007, vol. 104, No. 34, whole document (4 pages).

P. Notten et al., "3-D Integrated All-Solid-State Rechargeable Batteries", Adv. Mater., 19, 4564, 2007, whole document (4 pages).

L. Baggetto et al., "High Energy Density All-Solid-State Batteries: A Challenging Concept Towards 3D Integration", Adv. Fun. Mater., 18, 1057, 2008, whole document (10 pages).

D. Lee et al., "Highly Ordered Nanoporous Template from Triblock Copolymer", ACS Nano, 5, No. 2, 1207, 2011, whole document (8 pages).

M. Scherer et al., "Enhanced Electrochromism in Gyroid-Structured Vanadium Pentoxide", Adv. Mater., DOI: 10.1002/adma.201104272, 2012, whole document (5 pages).

H. Zhang et al, "Three-dimensional bicontinuous ultrafast-charge and -discharge bulk battery electrodes", Nature Nanotechnology, 6, 277, 2011, whole document (5 pages).

* cited by examiner

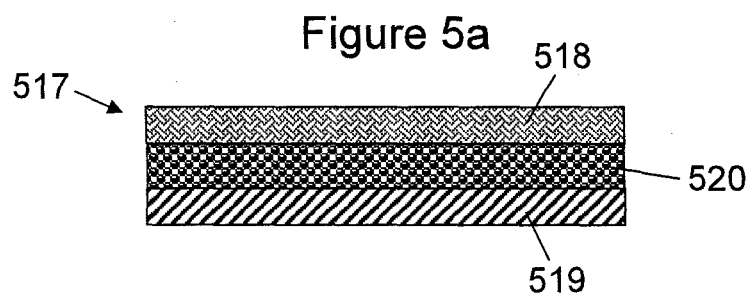
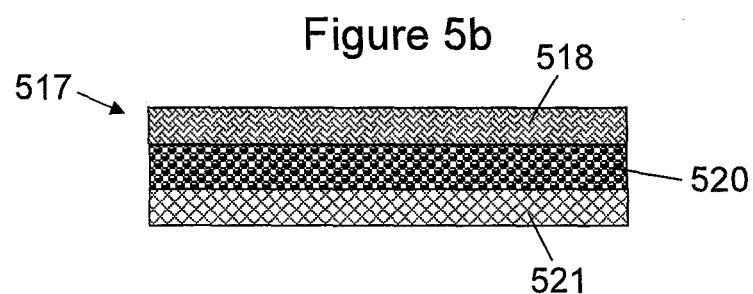
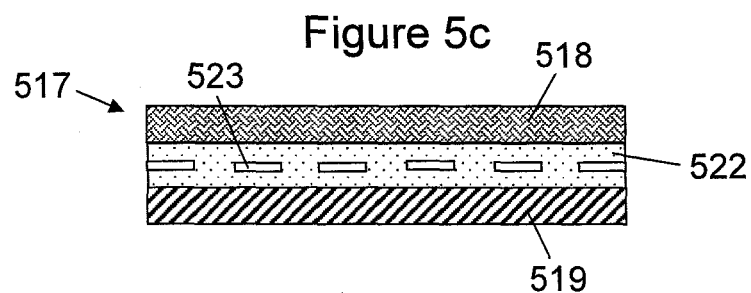

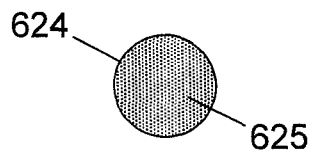
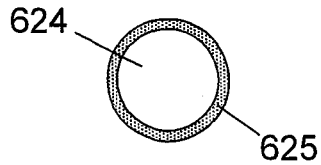
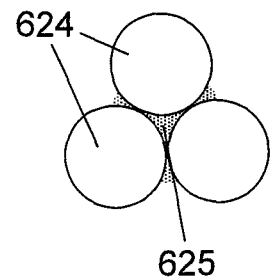
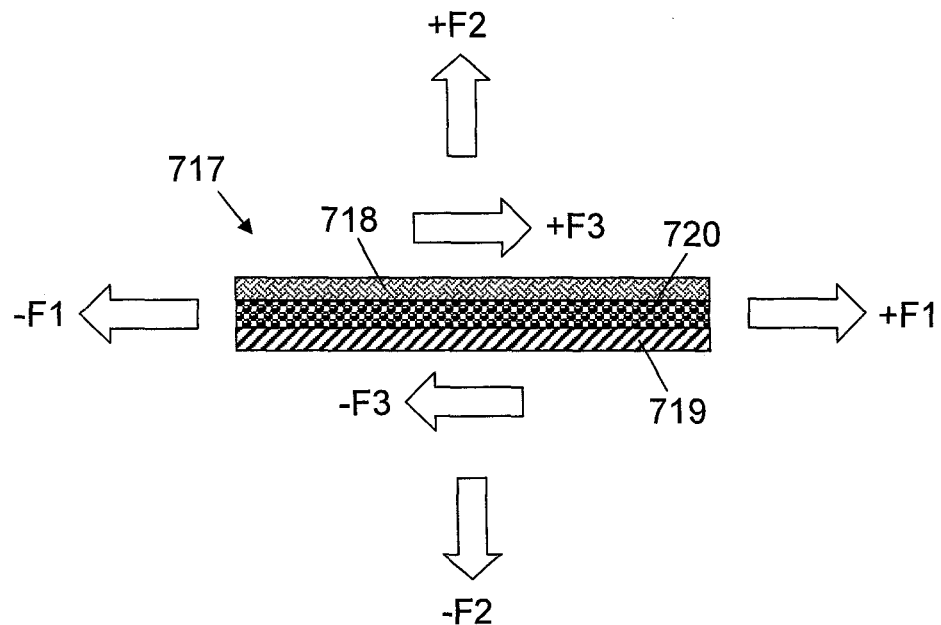
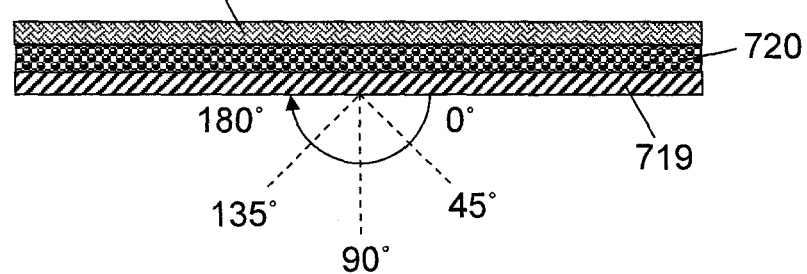

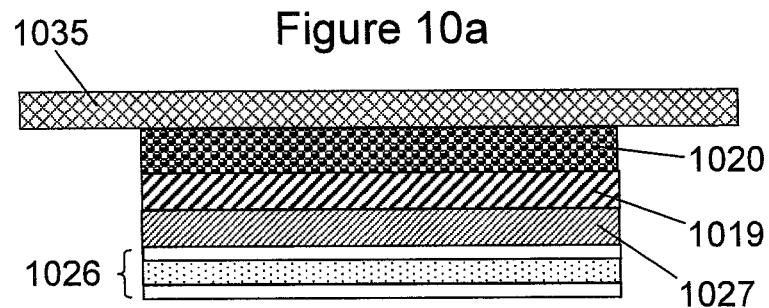
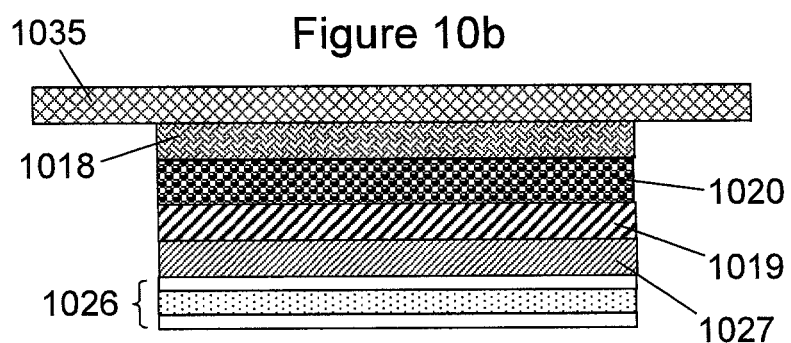
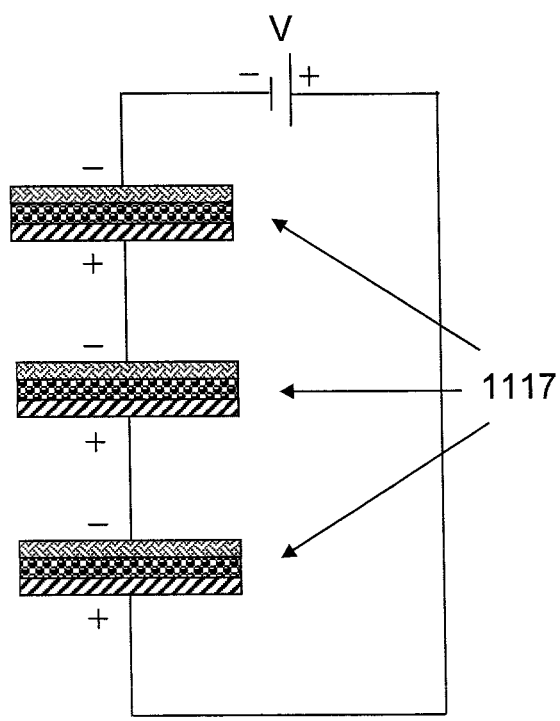

APPARATUS AND ASSOCIATED METHODS

TECHNICAL FIELD

The present disclosure relates to the field of flexible/bendable/stretchable electronics, associated methods and apparatus, and in particular concerns a flexible/bendable and/or stretchable electrical storage apparatus which may be suitable for use in wearable electronics. Certain disclosed example aspects/embodiments relate to portable electronic devices comprising the flexible and/or stretchable electrical storage apparatus, in particular, so-called hand-portable electronic devices which may be hand-held in use (although they may be placed in a cradle in use). Such hand-portable electronic devices include so-called Personal Digital Assistants (PDAs).

The portable electronic devices may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Wearable (or conformable) electronics is an emerging field of technology in which electronic devices are embedded in clothing (e.g. smart textiles). In order to retain the comfort of the clothing, such devices should be soft, flexible and to a certain degree stretchable. The majority of energy storage technologies in existence today, however, are in the form of bulk, solid pieces. Although thin-film flexible batteries exist, the flexibility of these devices is relatively limited due to delamination of the electrode materials. In addition, none of the currently available flexible cells are stretchable.

The apparatus and methods disclosed herein may or may not address this issue.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

According to a first aspect, there is provided an apparatus comprising a flexible substrate of electrically insulating material, and an electrically conductive polymer, wherein the electrically conductive polymer is retained by the flexible substrate to form together at least part of an electrode of an electrical storage apparatus such that the electrically conductive polymer provides an electrical path for electrons which are generated and/or stored by the electrical storage apparatus.

The apparatus may be configured for the generation (e.g. via redox reactions or an intercalation mechanism) and/or storage (e.g. via charge separation) of electrical energy.

The flexible substrate may comprise a plurality of interwoven fibres. The electrically conductive polymer may be retained by the flexible substrate by being absorbed into the fibres of the flexible substrate. The electrically conductive polymer may be retained by the flexible substrate by forming a surface coating on the fibres of the flexible substrate. The electrically conductive polymer may be retained by the flexible substrate by filling the spaces between the fibres of the flexible substrate.

The flexible substrate may be a textile material. The textile material may comprise one or more of cotton, polyester, nylon and lycra.

The electrically conductive polymer may comprise one or more of poly(3,4-ethylenedioxythiophene), polyaniline and polypyrrole.

According to a further aspect, there is provided an electrical storage apparatus comprising the apparatus described above. The electrical storage apparatus may comprise first and second electrodes. The apparatus described above may form at least part of the first electrode.

The second electrode may comprise one or more of a metal foil and an electrically conductive textile material. The metal foil may be a lithium metal foil. The electrically conductive textile material may comprise one or more silver particles, carbon particles, silicon particles and/or lithium salts supported on a plurality of interwoven fibres.

The electrical storage apparatus may comprise an electrolyte between the first and second electrodes. The term "electrolyte" may encompass both an electrically insulating material (e.g. dielectric) as used in conventional electrostatic capacitors, as well as an ionically conducting material as used in electrolytic capacitors and supercapacitors.

The electrolyte may be a liquid or gel electrolyte. The electrolyte may comprise propylene carbonate, an aqueous solution of potassium chloride, or any ionically conducting medium which is chemically resistant to the flexible substrate and the electrically conductive polymer. The gel electrolyte may comprise a monovalent acrylate polymer matrix.

When a liquid electrolyte is used, the electrical storage apparatus may comprise a separator configured to prevent physical contact between the first and second electrodes. The separator may comprise one of more of the following: cotton, polyester, lycra, a fluoroelastomer, a polyester elastomer, a hydrocarbon elastomer, or any other insulating, stretchable fibre. The electrolyte may be contained within the separator (i.e. the separator is soaked in the electrolyte).

The first and/or second electrode may comprise an active material. The term "active material" may be taken to mean the electrode material which takes part in the charging/discharging mechanism of the electrical storage apparatus. In a battery, for example, the active material may be an electrode material which participates in an electrochemical reaction or intercalation mechanism. In a supercapacitor, on the other hand, the active material may be an electrode material which participates in the formation of an electric double layer.

The active material may comprise one or more of the following: carbon nanoparticles, carbon nanotubes, carbon nanohorns, a carbon nanotube network, graphene, graphene platelets, metal nanowires, a metal nanowire mesh, semiconductor nanowires, a semiconductor nanowire mesh, and metal oxide nanoparticles. Where the active material is for use in a battery, the active material may comprise $LiCoO_2$, $LiFeO_2$, Li metal, and graphite (preferably in a fibrous form). The active material may be optically transparent. The electrically conductive polymer may serve as the active material of the first electrode.

One or more of the flexible substrate, the electrically conductive polymer, the active material, the separator, and the electrolyte may be configured to undergo reversible stretching and/or bending. One or more of the flexible substrate, the electrically conductive polymer, the active material, the separator, and the electrolyte may be configured to undergo reversible stretching of up to 20%, 30%, 50%, or 100% tensile strain. One or more of the flexible substrate, the electrically conductive polymer, the active material, the separator, and the electrolyte may be configured to undergo reversible bending to an angle of 45°, 90°, 135°, or 180°. One or more of the flexible substrate, the electrically conductive polymer, the active material, the separator, and the electrolyte may be sufficiently flexible and/or stretchable to render the electrical storage apparatus suitable for use in flex-to-install, stretch-to-install, dynamic stretch, and/or dynamic flex applications.

In an unflexed and unstretched state, the electrical storage apparatus may have a generally planar form. One or more of the flexible substrate, the electrically conductive polymer, the active material, the separator, and the electrolyte may be configured to undergo reversible stretching substantially parallel to the plane of the electrical storage apparatus. One or more of the flexible substrate, the electrically conductive polymer, the active material, the separator, and the electrolyte may be configured to be reversibly bent about an axis substantially parallel to the plane of the electrical storage apparatus.

The electrical storage apparatus may be one or more of a battery (primary or secondary battery), a capacitor (electrostatic, electrolytic, or supercapacitor), and a battery-capacitor hybrid.

According to a further aspect, there is provided a device comprising the electrical storage apparatus described above. The device may comprise an electricity-generating elastomer configured to generate electricity in response to applied mechanical strain. The electrical storage apparatus may be configured to store the electricity generated by the electricity-generating elastomer. The electricity-generating elastomer may be positioned on one or both sides of the electrical storage apparatus. The electricity-generating elastomer may comprise one or more of a piezoelectric polymer, a dielectric electroactive polymer (dielectric elastomer), a ferroelectric polymer, an electrostrictive graft polymer, a liquid crystalline polymer, an ionic electroactive polymer, an electrorheological fluid, and an ionic polymer-metal composite.

The device may be one or more of an electronic device, a portable electronic device, a portable telecommunications device, and a module for any of the aforementioned devices.

According to a further aspect, there is provided an item of clothing comprising the electrical storage apparatus described above. The flexible substrate may be formed from a layer of the item of clothing. The electrical storage apparatus may be attached to a layer of the item of clothing. The electrical storage apparatus may be attached to the layer of the item of clothing by being glued or sewn onto the layer of the item of clothing.

According to a further aspect, there is provided a protective pouch comprising the electrical storage apparatus described above. The flexible substrate may be formed from a layer of the protective pouch. The electrical storage apparatus may be attached to a layer of the protective pouch. The electrical storage apparatus may be attached to the layer of the protective pouch by being glued or sewn onto the layer of the protective pouch. The protective pouch may comprise a first coil configured to couple inductively to a second coil of a device. The inductive coupling between the first and second coils may be configured to enable the transfer of electrical energy generated and/or stored by the electrical storage apparatus to the device.

According to a further aspect, there is provided a method comprising depositing an electrically conductive polymer onto a flexible substrate of electrically insulating material so that the electrically conductive polymer is retained by the flexible substrate after deposition to form together at least part of an electrode of an electrical storage apparatus in which the electrically conductive polymer provides an electrical path for electrons which are generated and/or stored by the electrical storage apparatus.

Depositing the electrically conductive polymer onto the flexible substrate may comprise depositing a preformed electrically conductive polymer ink directly onto the flexible substrate.

The steps of any method disclosed herein do not have to be performed in the exact order disclosed, unless explicitly stated or understood by the skilled person.

Corresponding computer programs for implementing one or more of the methods disclosed are also within the present disclosure and encompassed by one or more of the described example embodiments.

The apparatus may comprise a processor configured to process the code of the computer program(s). The processor may be a microprocessor, including an Application Specific Integrated Circuit (ASIC).

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

FIG. 5a illustrates schematically a reversibly flexible and/or stretchable storage cell according to a first embodiment;

FIG. 5b illustrates schematically the reversibly flexible and/or stretchable storage cell according to the second embodiment;

FIG. 5c illustrates schematically the reversibly flexible and/or stretchable storage cell according to a third embodiment;

FIG. 6a illustrates schematically a fibre of the flexible substrate into which the electrically conductive polymer has been absorbed;

FIG. 6b illustrates schematically a fibre of the flexible substrate which has been coated with the electrically conductive polymer;

FIG. 6c illustrates schematically a plurality of fibres of the flexible substrate comprising the electrically conductive polymer in the space therebetween;

FIG. 7a illustrates schematically different types of tensile stress that may be applied to the reversibly flexible and/or stretchable storage cell;

FIG. 7b illustrates schematically the extent to which the reversibly flexible and/or stretchable storage cell may be bent about an axis parallel to the plane of the storage cell;

FIG. 10a illustrates schematically a reversibly flexible and/or stretchable storage cell in which the flexible substrate is formed from a textile layer of the item of clothing of FIG. 9a or from a textile layer of the protective pouch of FIG. 9b;

FIG. 10b illustrates schematically a reversibly flexible and/or stretchable storage cell in which the flexible substrate is attached to a textile layer of the item of clothing of FIG. 9a or to a textile layer of the protective pouch of FIG. 9b;

FIG. 11a illustrates schematically a stack of reversibly flexible and/or stretchable storage cells connected in series;

DESCRIPTION OF SPECIFIC ASPECTS/EMBODIMENTS

In electrical circuits, batteries and capacitors are used to provide other components with electrical power. These power supplies operate in completely different ways, however.

Figure 1A:
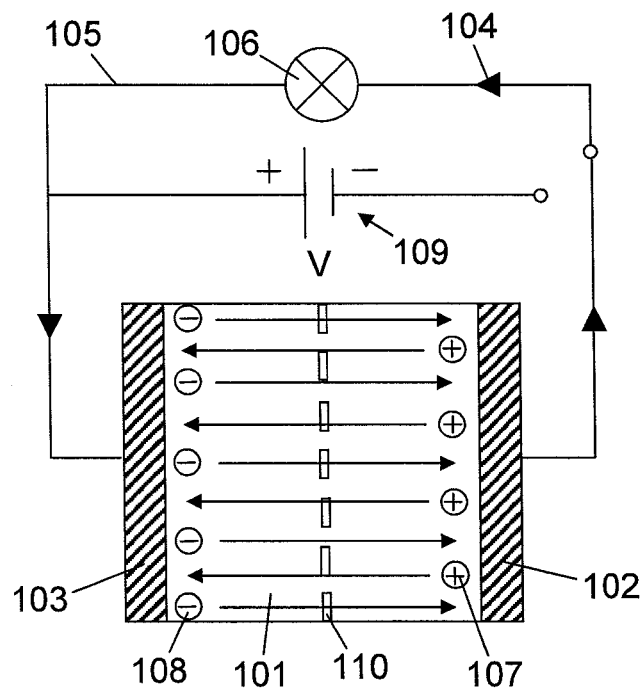
FIG. 1a illustrates schematically the discharge process of a conventional battery.

Batteries use electrochemical reactions to generate electricity. The discharge process of a conventional battery is shown in FIG. 1a. Batteries comprise two electrical terminals (electrodes 102, 103) separated by an electrolyte 101. A battery may also contain a separator 110 to prevent direct physical contact between the electrodes, which is particularly important when liquid electrolytes are used. At the negative electrode (the anode 102), an oxidation reaction takes place which produces electrons. These electrons flow round an external circuit 105 (indicated by the arrows 104) from the anode 102 to the positive electrode (the cathode 103) causing a reduction reaction to take place at the cathode 103. The flow of electrons can be used to power one or more electrical components 106 in the external circuit 105. The oxidation and reduction reactions may continue until the reactants are completely converted. Importantly though, unless electrons are able to flow from the anode 102 to the cathode 103 via the external circuit 105, the electrochemical reactions cannot take place. This allows batteries to store electricity for long periods of time. As the electrons flow round the external circuit from the anode 102 to the cathode 103, a negative charge cloud develops in the electrolyte 101 around the cathode 103, and a positive charge cloud develops in the electrolyte 101 around the anode 102. Positive 107 and negative 108 ions in the electrolyte 101 move to neutralise these charge clouds, allowing the reactions, and the flow of electrons, to continue. Without the ions 107, 108 from the electrolyte 101, the charge clouds around each electrode 102, 103 would inhibit the generation of electricity.

Figure 1B:
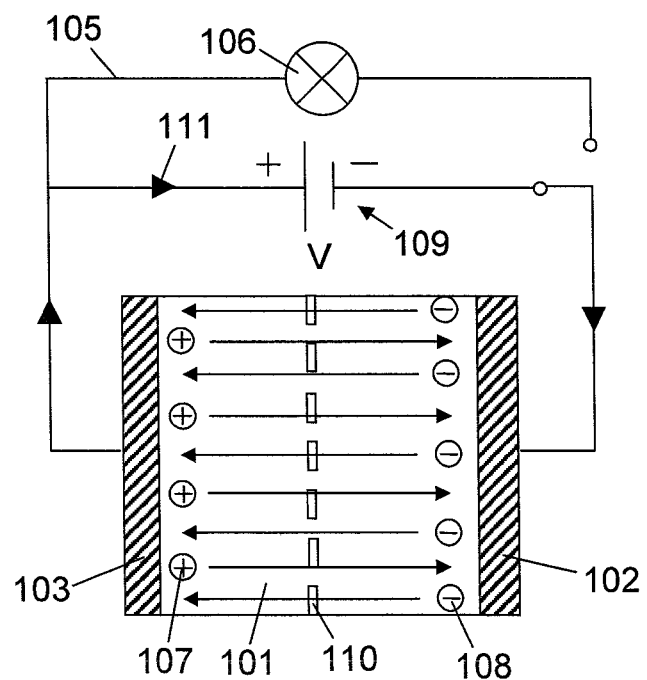
FIG. 1b illustrates schematically the charging process of a conventional battery.

A primary cell is any kind of battery in which the electrochemical reaction is not reversible. These are used as disposable batteries. With secondary batteries, on the other hand, the electrochemical reaction is reversible, meaning that the chemical reactants can be restored to their original state. These are used as rechargeable batteries. The charging process of a conventional rechargeable battery is shown in FIG. 1b. To charge the battery, a potential difference is applied between the anode 102 and cathode 103. The positive terminal of the charger 109 strips electrons from the cathode 103 and returns them to the anode 102 (indicated by the arrows 111), inducing chemical reactions at the electrode-electrolyte interface. Again, to compensate for the transfer of charge, positive 107 and negative 108 ions in the electrolyte 101 move between the electrodes 102, 103 in opposite directions to before.

The current and voltage generated by a battery is directly related to the materials used for the electrodes and electrolyte. The ability of a material to lose or gain electrons with respect to another material is known as its electrode potential. The strengths of oxidising and reducing agents are indicated by their standard electrode potentials. Materials with a positive electrode potential are used to form the anode, whilst those with a negative electrode potential are used to form the cathode. The greater the difference between the anode and cathode potentials, the greater the amount of electrical energy that can be produced by the cell.

Lithium appears at the top of the electrochemical series (large negative electrode potential), indicating that it is the strongest reducing agent. Likewise, fluorine appears at the bottom of the electrochemical series (large positive electrode potential), indicating that it is the strongest oxidising agent. As a result of lithium's high electrode potential, lithium batteries are capable of producing voltages of nearly 4V, over twice the voltage of a zinc-carbon or alkaline battery. Depending on the choice of materials for the anode, cathode and electrolyte, the current, voltage, capacity, life and safety of a lithium battery can change dramatically. Recently, novel architectures have been employed to improve the performance of these batteries. Pure lithium is very reactive and will rigorously react with water to form lithium hydroxide and hydrogen gas. For this reason, non-aqueous electrolytes are used, and water is rigidly excluded from the battery pack using a sealed container.

That said, many different lithium batteries exist because of lithium's low reactivity with a number of cathodes and non-aqueous electrolytes. The term "lithium battery" refers to a family of different chemistries comprising lithium metal or lithium compounds as the anode with a host of different materials for the cathodes and electrolytes. A porous carbon material often serves as a cathode charge collector to receive electrons from the external circuit.

A lithium-ion battery is a different type of rechargeable battery which uses a lithium ion "intercalation" mechanism rather than traditional redox reactions. This involves the insertion of lithium ions into and out of the crystal structure of the electrodes as the ions pass back and forth between the electrodes during charging and discharging. To achieve this, the electrodes require open crystal structures which allow the insertion and extraction of lithium ions, and the ability to accept compensating electrons at the same time. Such electrodes are called "intercalation hosts". Lithium-ion batteries are currently one of the most popular types of battery for portable electronics because they exhibit one of the best energy-to-weight ratios, no memory effect, a slow loss of charge when not in use. Furthermore, because lithium-ion batteries comprise a lithium compound electrode rather than a lithium metal electrode (which is highly reactive), they are inherently safer than lithium metal batteries.

In a typical lithium-ion battery, the anode is made from carbon, the cathode is a metal oxide, and the electrolyte is a lithium salt in an organic solvent. Commercially, the most popular anode material is graphite, and the cathode is generally one of three materials: a layered oxide (such as lithium cobalt oxide), one based on a polyanion (such as lithium iron phosphate), or a spinel (such as lithium manganese oxide). The electrolyte is typically a mixture of organic carbonates such as ethylene carbonate or diethyl carbonate containing complexes of lithium ions. These non-aqueous electrolytes often comprise non-coordinating anion salts such as lithium hexafluorophosphate ($LiPF_6$), lithium hexafluoroarsenate monohydrate ($LiAsF_6$), lithium perchlorate ($LiClO_4$), lithium tetrafluoroborate ($LiBF_4$), and lithium triflate ($LiCF_3SO_3$).

Figure 2A:
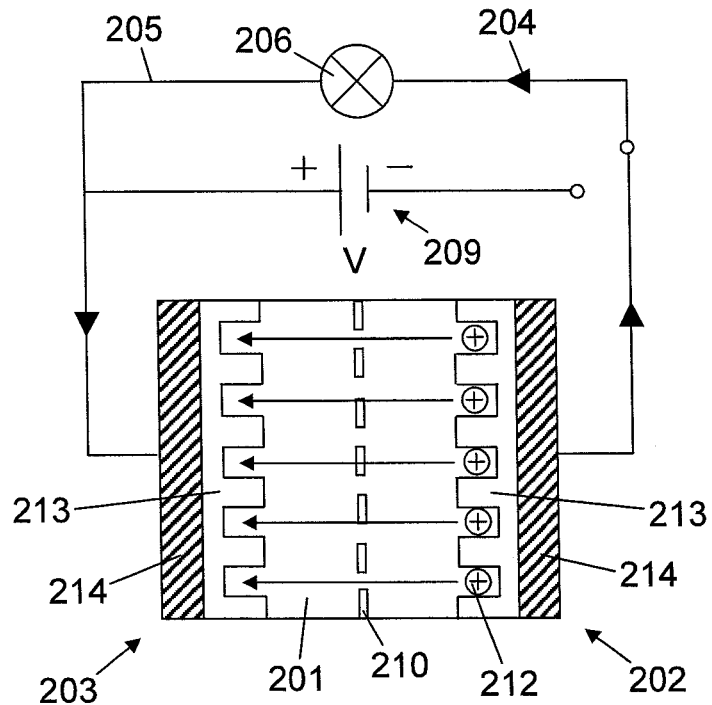
FIG. 2a illustrates schematically the discharge process of a lithium-ion battery.
Figure 2B:
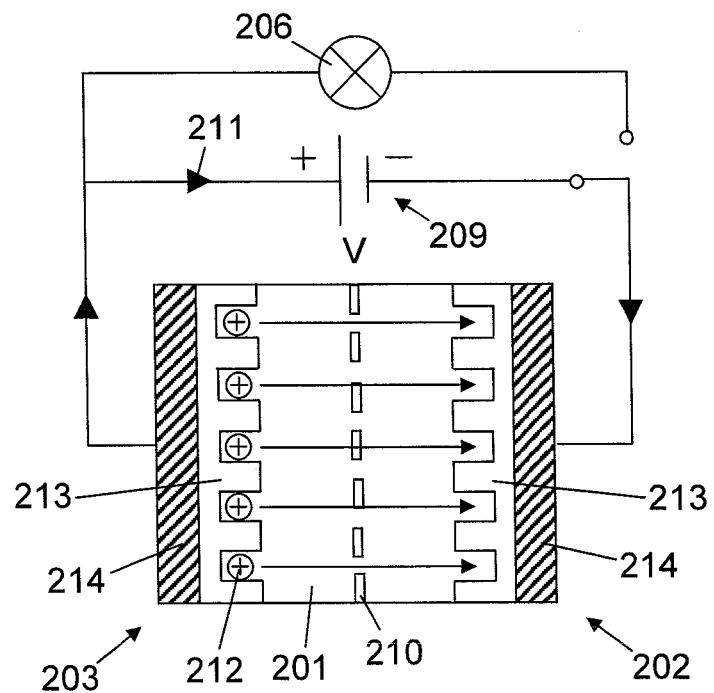
FIG. 2b illustrates schematically the charging process of a lithium-ion battery.

FIGS. 2a and 2b illustrate schematically the discharge and charging processes of a lithium-ion battery, respectively. As shown in the figures, the anode 202 and cathode 203 each comprise an open-crystal intercalation material 213 deposited on top of a charge-collecting substrate 214. During discharge, lithium ions 212 are extracted from the anode 202, migrate across the electrolyte 201, and are inserted into the crystal structure of the cathode 203. At the same time, compensating electrons travel in the external circuit (in a direction indicated by the arrows 204) and are accepted by the cathode 203 to balance the reaction. This process is reversible. During charging, an external electrical power source (the charger 209) applies a potential difference between the electrodes 202, 203 forcing the electrons to travel in the opposite direction (indicated by the arrows 211). The lithium ions 212 are then extracted from the cathode 203, migrate across the electrolyte 201, and are inserted back into the crystal structure of the anode 202.

In a lithium-ion battery, the lithium ions are transported to and from the cathode and anode, with the transition metal, cobalt (Co), in $Li_xCoO_2$ being oxidised from $Co^{3+}$ to $Co^{4+}$ during charging, and reduced from $Co^{4+}$ to $Co^{3+}$ during discharge. The anode and cathode half-reactions for a lithium-ion battery comprising a graphite anode and a lithium cobalt oxide cathode are as follows:

$$\text{Anode } xLi^+ + xe^- + 6C \rightleftarrows Li_xC_6 \quad \text{Equation 1}$$

$$\text{Cathode } LiCoO_2 \rightleftarrows Li_{1-x}CoO_2 + xLi^+ + xe^- \quad \text{Equation 2}$$

The overall reaction has its limits, however. Overdischarging the lithium-ion battery can supersaturate the lithium cobalt oxide, leading to the production of lithium oxide, by the following irreversible reaction:

$$Li^+ + LiCoO_2 \rightarrow Li_2O + CoO \quad \text{Equation 3}$$

whilst overcharging the lithium-ion battery can lead to the synthesis of $Co^{4+}$ by the following irreversible reaction:

$$LiCoO_2 \rightarrow Li^+ + CoO_2 \quad \text{Equation 4}$$

In contrast to batteries, capacitors store charge electrostatically, and are not capable of generating electricity. A relatively new type of capacitor known as a "supercapacitor" (also known as an electric double layer capacitor, an ultracapacitor, a pseudocapacitor, and an electrochemical double layer capacitor) offers greater energy storage than a conventional or electrolytic capacitor, and is becoming increasingly popular for portable electronic applications.

Figure 3A:
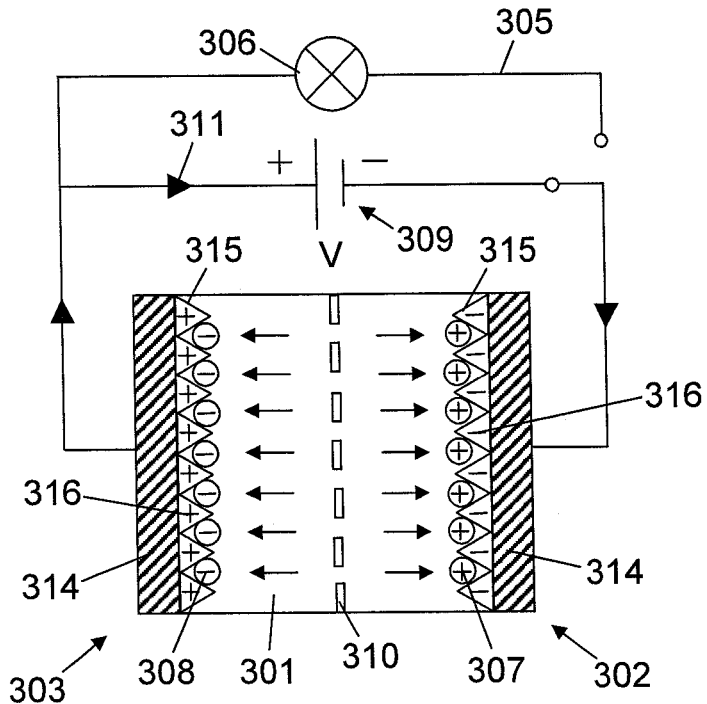
FIG. 3a illustrates schematically the charging process of a supercapacitor.
Figure 3B:
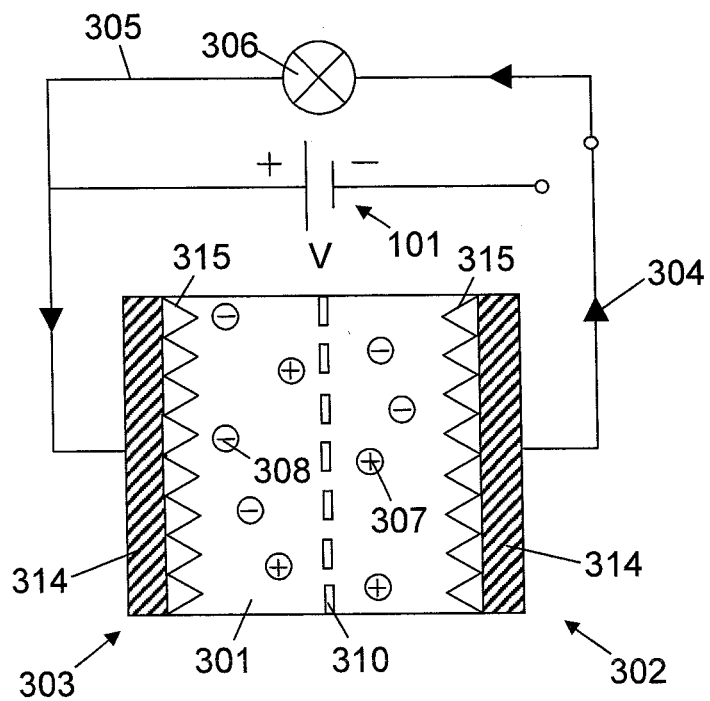
FIG. 3b illustrates schematically the discharge process of a supercapacitor.

FIGS. 3a and 3b illustrate schematically the charging and discharge processes of a supercapacitor, respectively. Supercapacitors have a cathode 303 and an anode 302, each comprising an electrically conducting plate 314 (charge collector), which are separated by an electrolyte 301. When a liquid electrolyte is used, the supercapacitor may also comprise a separator 310 to prevent direct physical contact between the cathode and anode. The plates 314 are coated in a porous material 315 (such as powdered carbon) to increase their surface area for greater charge storage. When a power supply (charger) applies a potential difference between the electrodes 302, 303, the electrolyte 301 becomes polarised. The potential on the cathode 303 attracts negative ions 308 in the electrolye 301, and the potential on the anode 302 attracts positive ions 307.

Unlike batteries, the applied potential is kept below the breakdown voltage of the electrolyte 301 to prevent electrochemical reactions from taking place at the surface of the electrodes 302, 303. For this reason, supercapacitors cannot generate electricity like electrochemical cells. Also, without electrochemical reactions taking place, no electrons are generated. As a result, no significant current can flow between the electrolyte 301 and the electrodes 302, 303. Instead, the ions 307, 308 in solution arrange themselves at the surfaces of the electrodes 302, 303 to mirror the surface charge 316 and form an insulating "electric double layer". In an electric double layer (i.e. a layer of surface charge 316 and a layer of ions 307, 308), the separation of the surface charge 316 and ions 307, 308 is on the order of nanometers. The combination of the electric double layer and the use of a high surface area material 315 on the surface of the plates 314 allow a huge number of charge carriers to be stored at the electrode-electrolyte interface.

To discharge the supercapacitor, an electrical connection 305 is made between the charged electrodes 302, 303, causing electrons to flow from the anode to the cathode via the external circuit (as indicated by the arrows 304). This flow of charge can be used to power one or more electrical components 306 in the external circuit 305.

Supercapacitors have several advantages over batteries, and as a result, have been tipped to replace batteries in many applications. They function by supplying large bursts of current to power a device and then quickly recharging themselves. Their low internal resistance, or equivalent series resistance (ESR), permits them to deliver and absorb these large currents, whereas the higher internal resistance of a traditional chemical battery may cause the battery voltage to collapse. Also, whilst a battery generally demands a long recharging period, supercapacitors can recharge very quickly, usually within a matter of minutes. They also retain their ability to hold a charge much longer than batteries, even after multiple chargings. When combined with a battery, a supercapacitor can remove the instantaneous energy demands that would normally be placed on the battery, thereby lengthening the battery lifetime.

Whereas batteries often require maintenance and can only function well within a small temperature range, supercapacitors are maintenance-free and perform well over a broad temperature range. Supercapacitors also have longer lives than batteries, and are built to last until at least the lifetime of the electronic devices they are used to power. Batteries, on the other hand, typically need to be replaced several times during the lifetime of a device.

Supercapacitors are not without their drawbacks, however. Despite being able to store a greater amount of energy than conventional and electrolytic capacitors, the energy stored by a supercapacitor per unit weight is considerably lower than that of an electrochemical battery. In addition, the working voltage of a supercapacitor is limited by the electrolyte breakdown voltage, which is not as issue with batteries.

Lithium-ion batteries have the highest energy density of all systems, whilst supercapacitors have the highest power density and lifetime. Recently, a new hybrid storage device called a lithium-ion capacitor has been developed which aims to integrate the advantages of lithium-ion batteries and supercapacitors. The cathode of a lithium-ion capacitor employs activated carbon at which charges are stored as an electric double layer at the interface between the carbon and the electrolyte, similar to a supercapacitor. The anode, on the other hand, is made of a nanostructured intercalation material pre-doped with lithium ions, similar to a lithium-ion battery. This pre-doping process lowers the anode potential and results in a high cell output voltage. Typically, output voltages for lithium-ion capacitors are in the range of 3.8V to 4V. As a consequence, lithium-ion capacitors have a high energy density.

Furthermore, the capacity of the anode is several orders of magnitude greater than the capacity of the cathode. As a result, the change in anode potential during charging and discharging is far smaller than the change in cathode potential. The intercalation anode can also be coupled with an intercalation cathode, such as $LiCoO_2$ or $LiMn_2O_4$, to increase the power of the lithium-ion capacitor. The electrolyte used in a lithium-ion capacitor is typically a lithium-ion salt solution, and a separator may be used to prevent direct physical contact between the anode and cathode.

Figure 4A:
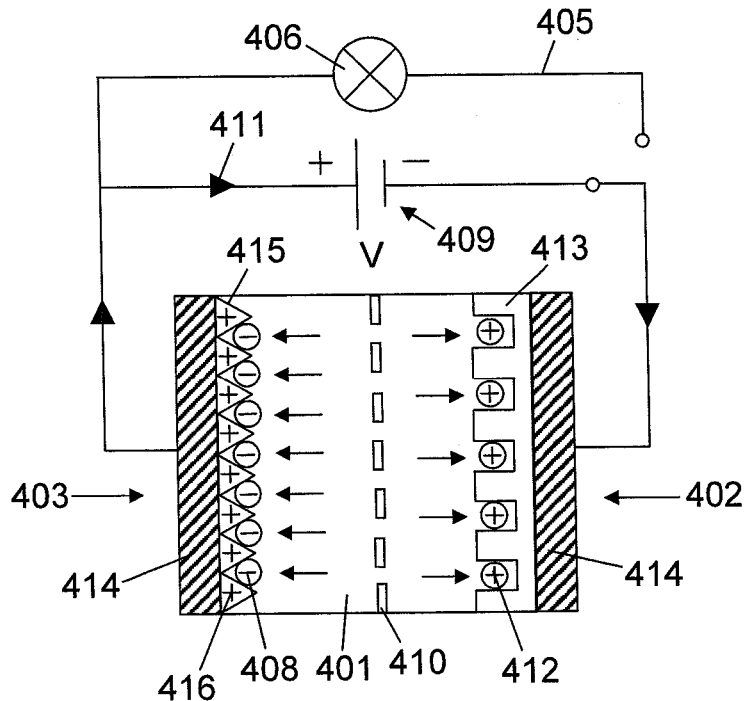
FIG. 4a illustrates schematically the charging process of a lithium-ion capacitor.
Figure 4B:
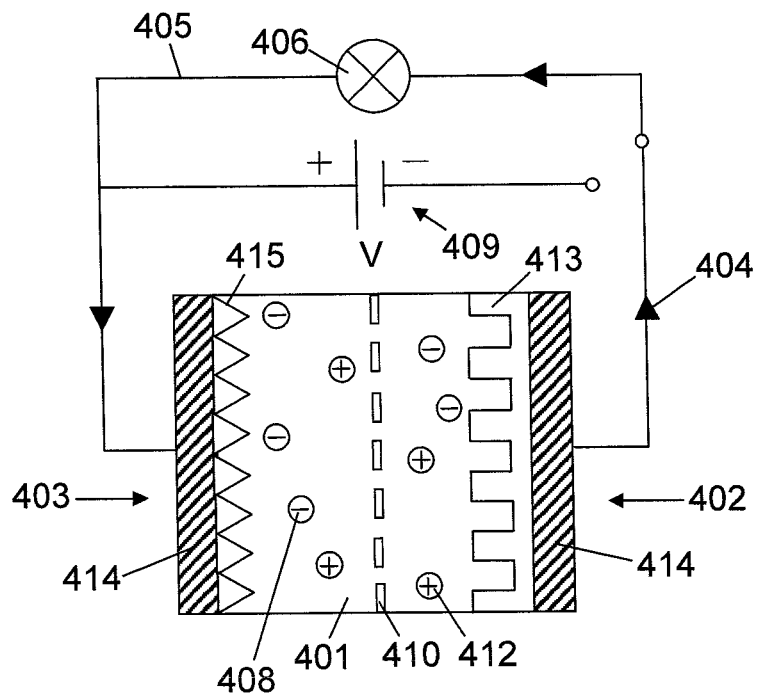
FIG. 4b illustrates schematically the discharge process of a lithium-ion capacitor.

FIGS. 4a and 4b illustrate schematically the charging and discharge processes of a lithium-ion capacitor, respectively. The behaviour of a lithium-ion capacitor is much the same as that of a supercapacitor, and therefore the reference numerals of FIGS. 4a and 4b correspond to similar features in FIGS. 3a and 3b. The main difference between the two systems, however, is that instead of positive ions in the electrolyte 401 arranging themselves at the electrode-electrolyte interface to form an electric double layer when the device charges, lithium ions 412 insert themselves (intercalation) into the crystal structure 413 of the anode 402. Like a lithium-ion battery, therefore, lithium-ion capacitors undergo fast electrochemical reactions and do not simply rely on the formation of an electric double layer to store electrical charge.

As mentioned in the background section, currently available storage cells are unable to satisfy the physical requirements of wearable electronics because the materials used to form these cells are insufficiently flexible and/or stretchable. There will now be described an apparatus and associated methods that may provide a solution to this problem.

FIGS. 5a-c show different embodiments of an electrical storage apparatus 517 (which may be a battery, a capacitor or a battery-capacitor hybrid) comprising first 518 and second 519 electrodes separated by an electrolyte 520. The first electrode 518 of the electrical storage apparatus 517 comprises a flexible (and possibly also stretchable) substrate of electrically insulating material and an electrically conductive polymer. The electrically conductive polymer is retained by the flexible substrate in such a way that the electrically conductive polymer provides an electrical path for electrons which are generated and/or stored by the electrical storage apparatus 517 (i.e. the electrically conductive polymer acts as a charge collector of the first electrode 518). Examples of suitable electrically conductive polymers include poly(3,4-ethylenedioxythiophene), polyaniline, and polypyrrole.

The flexible substrate may be a textile material (e.g. cotton, polyester, nylon, or lycra) comprising a plurality of interwoven fibres. The use of a textile material is advantageous for forming an electrode 518 of an electrical storage apparatus 517 for a number of reasons. First of all, textile materials are flexible and stretchable. These properties allow the electrical storage apparatus 517 to be incorporated into items of clothing as well as the increasingly small casings of modern electronic devices. Secondly, textile materials typically have high surface areas as a result of their interwoven nature. This feature may be used to increase the storage density of electrical storage cells by allowing the electrolyte 520 to interact with a greater amount of active electrode material. Thirdly, textile materials are absorbent. This property is useful for retaining the electrically conductive polymer in order to form the electrical path from the electrolyte 520 through the entire thickness of the electrode 518 to the external circuit (not shown).

The textile material may retain the electrically conductive polymer in different ways depending on the specific material used. For example, the electrically conductive polymer 625 may be absorbed into the fibres 624 of the textile material (FIG. 6a), it may form a surface coating on the fibres 624 of the textile material (FIG. 6b), and/or it may fill the space between the fibres 624 of the textile material (FIG. 6c).

The second electrode 519 of the electrical storage apparatus 517 may be formed from a number of different materials provided that it allows bending and/or stretching of the electrical storage apparatus 517. In the embodiment shown in FIG. 5a, the second electrode 519 of the electrical storage apparatus 517 comprises a metal foil (e.g. a lithium metal foil), and in the embodiment shown in FIG. 5b, the second electrode of the electrical storage apparatus 517 comprises an electrically conductive textile material. The electrically conductive textile material may comprise one or more silver particles, carbon particles, silicon particles and/or lithium salts (for example) supported on a plurality of interwoven fibres. For stretchable applications, the metal foil of FIG. 5a may be replaced with one or more metal meanders to allow for greater tensile strain.

Each electrode 518, 519 of the electrical storage apparatus 517 comprises an active material which takes part in the charging/discharging mechanism of the electrical storage apparatus 517. In a battery, for example, the active material is the electrode material that participates in the electrochemical reaction or intercalation mechanism. In a supercapacitor, on the other hand, the active material is the electrode material which participates in the formation of the electric double layer. In order for the electrical storage apparatus 517 to be reversibly stretched, the active material of the first and second electrodes should also be reversibly stretchable. The electrically conductive polymer may serve as the active material of the first electrode 518 (as well as serving as the charge collector), or a separate active material may be incorporated into the textile material in addition to the electrically conductive polymer. In the latter scenario, the separate active material (like the electrically conductive polymer) may be absorbed into the fibres of the textile material, it may form a surface coating on the fibres of the textile material, and/or it may fill the space between the fibres of the textile material. Whether or not a separate active material is required, however, will depend on the specific chemistry of the electrical storage apparatus 517.

In FIGS. 5a and 5b, the electrolyte 520 is in the form of a gel rather than a liquid. An advantage of using a gel electrolyte 520 is that, depending on the viscosity of the gel, a separator (used to prevent physical contact between the first 518 and second 519 electrodes and therefore electrical shorting) may not be necessary. FIG. 5c, on the other hand, shows an electrical storage apparatus 517 comprising a liquid electrolyte 522 and a separator 523. In practice, the liquid electrolyte 522 could be contained within (i.e. soaked into) the separator 523 if the separator 523 is sufficiently absorbent. For flexible and/or stretchable storage cells, it is important that the separator 523 (or gel electrolyte 520) is also reversibly flexible and/or stretchable. The electrolyte 520, 522 used will depend on the specific chemistry of the cell. Suitable separators 523, however, include textiles such as cotton, polyester or lycra, and porous elastomer membranes made from fluoroelastomers, polyester elastomers or hydrocarbon elastomers.

The arrows in FIG. 7a illustrate the directions of force that might be applied to the electrical storage apparatus 717 to induce tensile strain. When forces F1 and −F1 are applied, the electrical storage apparatus 717 undergoes reversible stretching in the plane of the cell (assuming the electrical storage apparatus 717 has a generally planar form). This has the effect of reducing the thickness of the electrical storage apparatus 717. On the other hand, when forces F2 and −F2 are applied, the electrical storage apparatus 717 undergoes reversible stretching perpendicular to the plane of the cell. This has the effect of increasing the thickness of the electrical storage apparatus 717. In addition, when forces F3 and −F3 are applied, the electrical storage apparatus 717 undergoes shearing strain. In this scenario, the first 718 and second 719 electrodes may move laterally (i.e. parallel to the plane of the cell) with respect to one another. Nevertheless, provided the electrodes 718, 719 remain in contact with the electrolyte 720, relative lateral movement of the electrodes 718, 719 should not adversely affect operation of the electrical storage apparatus 717.

As well as undergoing reversible stretching, the electrical storage apparatus 717 may be configured to undergo reversible bending (flexing), as illustrated in FIG. 7b. The extent to which the electrical storage apparatus 717 can be bent will depend on the number and flexibility of the various constituent layers. In some cases, the electrical storage apparatus 717 may be bent to an angle (bending angle) of 45°, 90°, 135° or 180° with respect to the plane of the cell.

Figure 8:
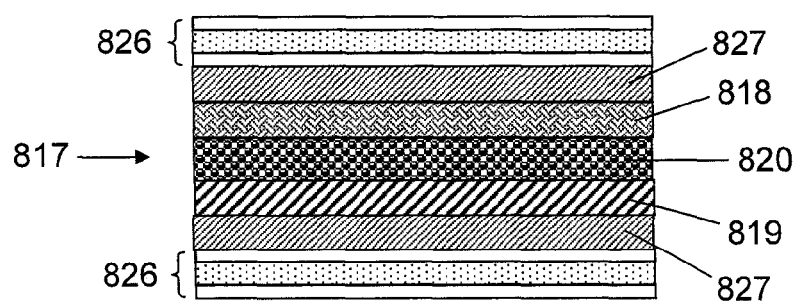
FIG. 8 illustrates schematically the reversibly flexible and/or stretchable storage cell comprising an electricity-generating elastomer.

The electrical storage apparatus 817 may also comprise an electricity-generating elastomer 826, as shown in FIG. 8. Electricity-generating elastomers 826 (also known as electroactive polymers) are similar to piezoelectric materials in the sense that applied mechanical stress can be used to create a potential difference. Unlike piezoelectric materials, which are typically rigid, electricity-generating elastomers 826 can be bendable and/or stretchable. This property renders them suitable for use in wearable electronics.

Figure 15A:
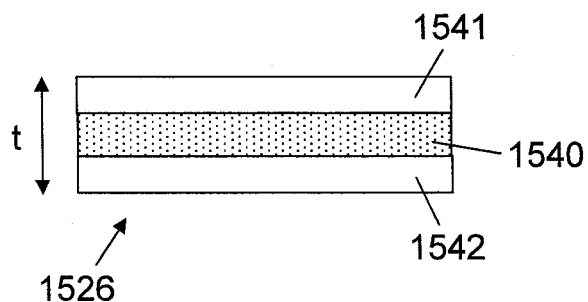
FIG. 15a illustrates schematically a dielectric elastomer in cross-section.
Figure 15B:
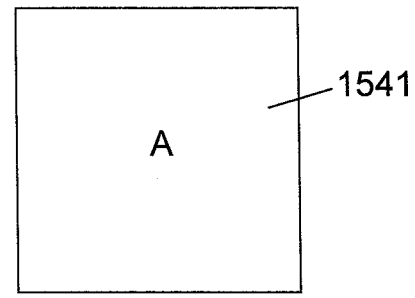
FIG. 15b illustrates schematically a dielectric elastomer in plan view.

One type of electricity-generating elastomer which would be suitable for use in the present apparatus is a dielectric elastomer 1526. FIGS. 15a and 15b show a dielectric elastomer 1526 in cross-section and plan view, respectively. As illustrated in FIG. 15a, the dielectric elastomer 1526 comprises a polymeric material 1540 (such as silicone, polyurethane or acrylic) sandwiched between two compliant electrodes 1541, 1542. From an electrical point of view, the dielectric elastomer 1526 forms a parallel plate capacitor in which the electrodes 1541, 1542 are the parallel plates and the polymer 1540 is the dielectric material therebetween. When the dielectric elastomer 1526 is bent and/or stretched, the area A (shown in FIG. 15b) and thickness t (shown in FIG. 15a) of the capacitor changes causing a variation in the capacitance of the structure 1526.

Figure 16:
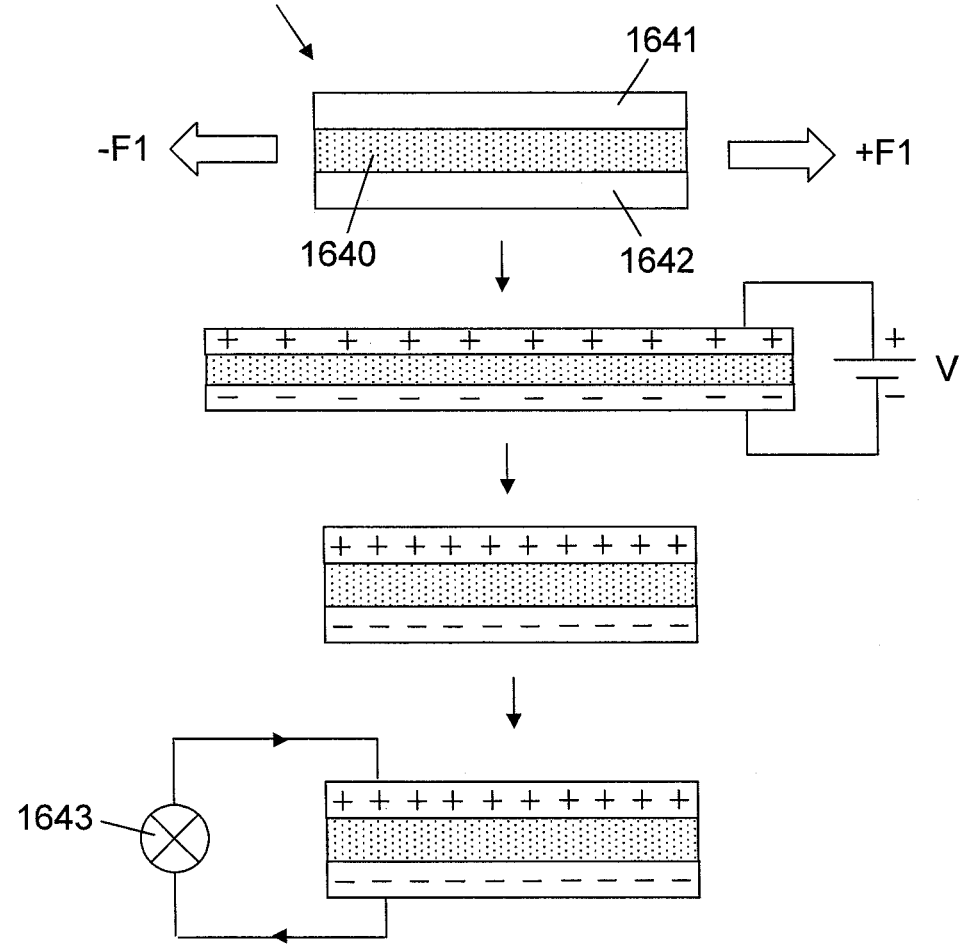
FIG. 16 illustrates schematically the energy conversion principle associated with a dielectric elastomer.

The energy conversion principle associated with dielectric elastomers 1626 is illustrated in FIG. 16. Starting from an initial state, a tensile force $\pm F_1$ is applied to the structure 1626 causing an increase in the area A of the capacitor and a decrease in the thickness t of the capacitor. The mechanical energy is converted to potential energy by the elasticity of the polymer 1640. Once the structure 1626 is fully stretched, electrical charges can be placed on the electrodes 1641, 1642 by applying a potential difference V across the stack. The amount of charge placed on the electrodes 1641, 1642 is limited by the breakdown field limit of the polymer 1640. When the tensile force $\pm F_1$ is subsequently removed, the structure 1626 contracts. This causes a decrease in the area A of the capacitor and an increase in the thickness t of the capacitor. During contraction of the structure 1626, the charges on opposite electrodes 1641, 1642 are pushed further apart (given the increased thickness of the polymer 1640) and the charges on each electrode 1641, 1642 are pushed closer together (given the decreased area A of the electrodes 1641, 1642). The elastic stresses in the polymer 1640 therefore work against the electric field pressure caused by the charges resulting in an increase in the electrostatic potential energy of the system. Once the structure 1626 has fully retracted, the electrical energy can be partially or completely removed. The electrical energy may be used to power one or more device components 1643, or may be used to charge the electrical storage apparatus.

Besides the energy harvesting cycle described above in which the electrodes 1641, 1642 comprise a constant amount of charge, two other cycles (termed the constant voltage and constant electric field energy harvesting cycles) could also be used. Details of these cycles can be found in the research publications entitled "*Energy harvesting using dielectric elastomers*" (B. Czech et al, Proceedings of the 14$^{th}$ International Power Electronics and Motion Control Conference, EPE-PEMC 2010, S4-18) and "*Multilevel high voltage converter driving dielectric elastomer generators*" (C. Graf et al, Proceedings of the 14$^{th}$ European Power Electronics and Applications Conference, EPE 2011, 1), both of which are incorporated herein by reference. Variations of any of these cycles could also be used.

In FIG. 8, the structure comprises electricity-generating elastomer layers 826 adjacent to the first 818 and second 819 electrodes of the electrical storage apparatus 817, with an energy harvesting circuit 827 positioned between each electricity-generating elastomer layer 826 and the respective electrode 818, 819 (although the energy harvesting circuit 827 could be positioned on the external surface of each electricity-generating elastomer layer 826). The energy harvesting circuits 827 are used to apply a potential to the electrodes 1641, 1642 of the adjacent electricity-generating elastomer layer 826 (i.e. to control charging of the electricity-generating elastomer 826), and to transfer the energy generated by the electricity-generating elastomer 826 to the electrical storage apparatus 817 or one or more device components (i.e. to control discharging of the electricity-generating elastomer 826). In practice, the structure may comprise any number of electricity-generating elastomer layers 826 (even just one layer). In addition, a single energy harvesting circuit 827 may be sufficient to control the charging and discharging of all layers of electricity-generating elastomer 826.

Figure 9A:
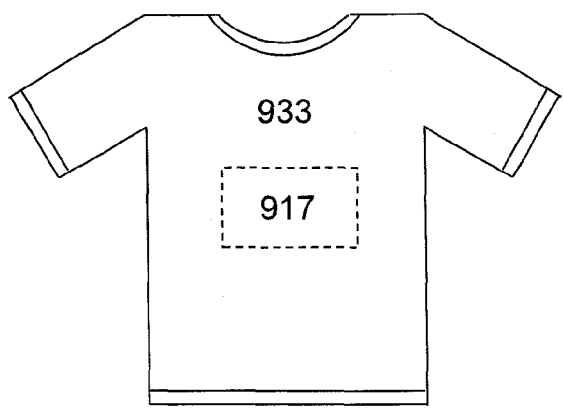
FIG. 9a illustrates schematically an item of clothing comprising the reversibly flexible and/or stretchable storage cell.

The whole concept of wearable electronics is that fully-functioning electronic components and devices can be integrated within items of clothing with minimal impact on the flexibility and stretchability of the textile. The flexible and/or stretchable storage cells described herein may be able to satisfy this requirement. FIG. 9a shows a t-shirt 933 comprising the storage cell 917. As illustrated in FIG. 10a, the t-shirt fabric 1035 itself may form the flexible substrate of the first electrode (i.e. the electrical storage apparatus 917 is integrated with the t-shirt 933). On the other hand, the flexible substrate of the first electrode 1018 could be attached to the t-shirt fabric 1035 (i.e. the electrical storage apparatus 917 is retro-fit to the t-shirt 933), as shown in FIG. 10b. In the latter case, the storage cell 917 may be attached to a layer of the t-shirt fabric 1035 by gluing, thermally attaching, or sewing the storage cell 917 to the layer of fabric 1035.

Figure 9B:
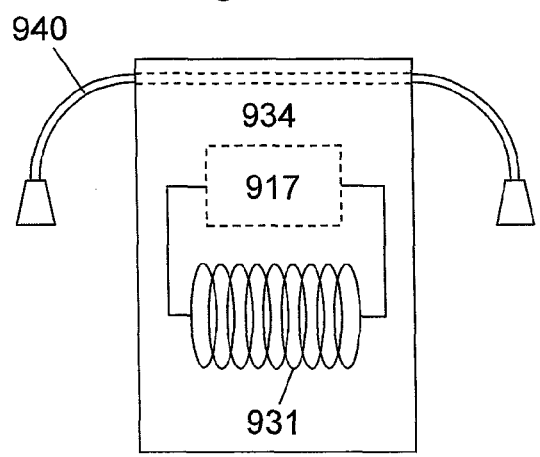
FIG. 9b illustrates schematically a protective pouch comprising the reversibly flexible and/or stretchable storage cell.

Besides items of clothing, the electrical storage apparatus 917 could also be integrated within (FIG. 10a) or attached to (FIG. 10b) other fabric-based items. One example is a protective pouch 934 used to protect portable electronic devices (such a mobile phones and mp3 players) from scratches, as shown in FIG. 9b. Such protective pouches 934 are typically formed from textile materials and can be opened and closed through the use of a drawstring 940. By including the electrical storage apparatus 917 in a protective pouch 934, the protective pouch 934 could be used as a backup source of electrical power for the portable electronic device in the event that the battery of the portable electronic device runs out of charge. In this scenario, the electrical storage apparatus 917 of the protective pouch 934 may be used to power the portable electronic device directly and/or may be used to recharge the battery of the portable electronic device.

The electrical storage apparatus 917 could be connected to the portable electronic device via a wired or wireless connection. Regarding wireless connections, the protective pouch 934 and portable electronic device could be configured to couple to one another inductively. To achieve this, the protective pouch 934 (as shown in FIG. 9b) and the portable electronic device would each require an induction coil 931. An alternating current (created using the potential difference generated by the electrical storage apparatus 917 of the protective pouch 934) could then be passed through the induction coil 931 of the protective pouch 934 to generate an alternating electromagnetic field in the vicinity of the induction coil of the portable electronic device. The electromagnetic field would generate an alternating current in the induction coil of the portable electronic device which may be used to power the portable electronic device or charge the battery of the portable electronic device.

As well as wearable electronics, the present apparatus may also find use in modern electronic devices in general. In modern devices, miniaturisation is an important factor, and state-of-the-art batteries and supercapacitors do not adequately fulfil the size requirements. The electrical storage apparatus described herein may provide a solution to this problem. Flex-to-install and dynamic flex circuit boards are becoming more commonplace. Flex-to-install refers to a circuit board (e.g. a flexible printed circuit (FPC) board) which is bent or folded during device assembly, but which undergoes minimal flexing during the lifetime of the device. If the circuit board is sufficiently durable, however, it may also be suitable for dynamic flex applications in which the circuit board is required to bend both during and after device assembly. Stretchable devices may also require circuit boards which can undergo stretching during and/or after device assembly (i.e. stretch-to-install and/or dynamic stretch applications). The present apparatus may allow this concept to be extended to the storage cells of the device, which may be bent or stretched in order to fit inside the smallest of device casings. The stretchable storage cells could be attached to the FPC boards of the device.

Given that batteries and capacitors are used to power other electronic components in a device, the electrical characteristics (e.g. operating current, voltage, resistance, capacitance, etc) of the battery/capacitor are an important consideration. In general, the maximum operating voltage of a supercapacitor is limited by the breakdown voltage of the electrolyte (~1.1V for aqueous electrolytes and ~2.3V for organic electrolytes), whilst the maximum operating voltage of a battery is limited by the active materials used in the electrochemical reactions. In order to increase the operating voltage of a storage cell 1117 (battery or capacitor), several cells 1117 may be connected in series (e.g. as a stack of storage cells 1117), as shown in FIG. 11a. The total voltage for three storage cells connected in series is given by $V_{total}=V_1+V_2+V_3$, where $V_n$, is the operating voltages of the respective cells. When connected in series, the total current is given by $I_{total}=I_1=I_2=I_3$, the total resistance is given by $R_{total}=R_1+R_2+R_3$, and the total capacitance (relevant for supercapacitors) is given by $C_{total}=1/C_1+1/C_2+1/C_3$, where $I_n$, $R_n$ and $C_n$ are the operating current, resistance and capacitance of the respective cells.

Figure 11B:
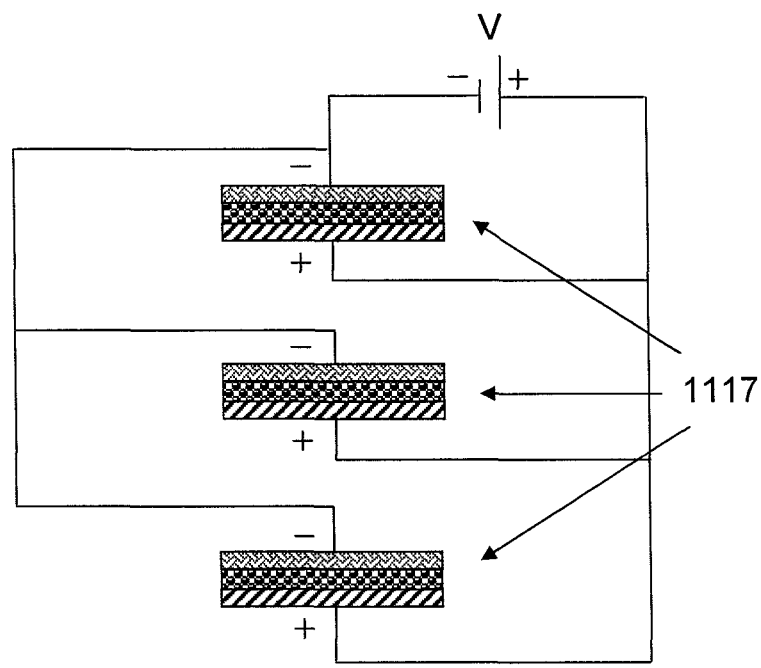
FIG. 11b illustrates schematically a stack of reversibly flexible and/or stretchable storage cells connected in parallel.

On the other hand, several cells 1117 could be connected in parallel (e.g. as a stack of storage cells 1117), as shown in FIG. 11b. In this configuration, the total voltage is given by $V_{total}=V_1=V_2=V_3$, the total current is given by $I_{total}=I_1+I_2+I_3$, the total resistance is given by $R_{total}=1/R_1+1/R_2+1/R_3$, and the total capacitance (relevant for supercapacitors) is given by $C_{total}=C_1+C_2+C_3$.

Figure 12:
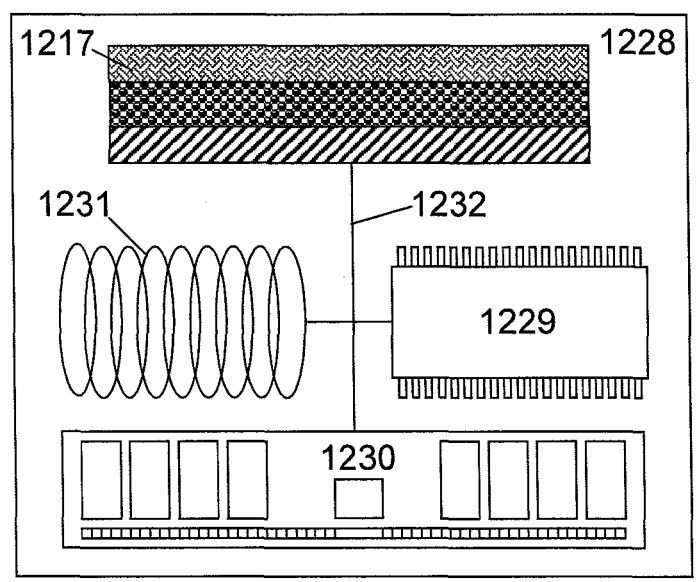
FIG. 12 illustrates schematically a device comprising the reversibly flexible and/or stretchable storage cell.

FIG. 12 illustrates schematically a device 1228 comprising the electrical storage apparatus 1217 described herein. The device 1228 also comprises a processor 1229, a storage medium 1230 and an induction coil 1231, which are electrically connected to one another by a data bus 1232. The device 1228 may be an electronic device, a portable electronic device, a portable telecommunications device, or a module for any of the aforementioned devices.

The electrical storage apparatus 1217 is configured to generate and/or store electrical energy, which may be used to power one or more components of the device 1228. The electrical storage apparatus 1217 is configured to undergo reversible flexing and/or stretching, and may be attached to an FPC board of the device 1228.

The processor 1229 is configured for general operation of the device 1228 by providing signalling to, and receiving signalling from, the other device components to manage their operation.

The storage medium 1230 is configured to store computer code configured to perform, control or enable operation of the electrical storage apparatus 1217. The storage medium 1230 may also be configured to store settings for the other device components. The processor 1229 may access the storage medium 1230 to retrieve the component settings in order to manage the operation of the device components. In particular, the storage medium 1230 may comprise voltage settings for charging the electrical storage apparatus 1217. The storage medium 1230 may be a temporary storage medium such as a volatile random access memory. On the other hand, the storage medium 1230 may be a permanent storage medium such as a hard disk drive, a flash memory, or a non-volatile random access memory.

The induction coil 1231 is configured to couple inductively to an induction coil of an external apparatus (e.g. the protective pouch 934 shown in FIG. 9b). In this way, electrical power can be transferred from the external apparatus to the device 1228 via an electromagnetic field. The electrical power may be used to power one or more components of the device 1228 directly, or it may be used to charge the electrical storage apparatus 1217 (which can in turn be used to power one or more components of the device 1228).

Figure 13:
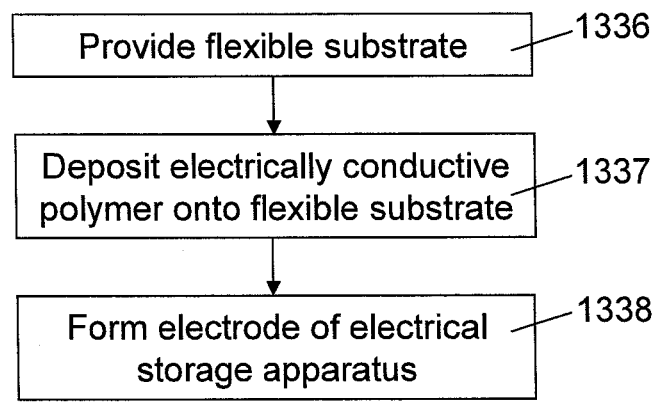
FIG. 13 illustrates schematically a method of making a first electrode of the reversibly flexible and/or stretchable storage cell.

The main steps 1336-1338 of the method used to make the first electrode of the electrical storage apparatus are illustrated schematically in FIG. 13. Essentially, the electrically conductive polymer is deposited onto the flexible substrate of the first electrode in such a way that the electrically conductive polymer is retained by the flexible substrate after deposition. Deposition of the electrically conductive polymer may involve spraying an electrically conductive polymer ink directly onto the flexible substrate, or dipping the flexible substrate into a bath of electrically conductive polymer ink. When the flexible substrate comprises a plurality of interwoven fibres, the polymer may be deposited (e.g. by spraying or dipping) onto each fibre before the fibres are interwoven to form the flexible substrate.

Figure 14:
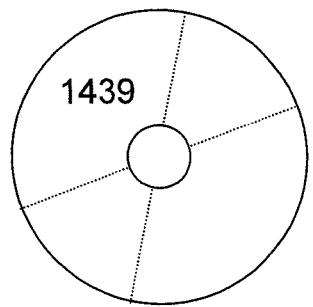
FIG. 14 illustrates schematically a computer readable medium providing a program for controlling the method of making the first electrode of the reversibly flexible and/or stretchable storage cell.

FIG. 14 illustrates schematically a computer/processor readable medium 1439 providing a computer program according to one embodiment. In this example, the computer/processor readable medium 1439 is a disc such as a digital versatile disc (DVD) or a compact disc (CD). In other embodiments, the computer/processor readable medium 1439 may be any medium that has been programmed in such a way as to carry out an inventive function. The computer/processor readable medium 1439 may be a removable memory device such as a memory stick or memory card (SD, mini SD or micro SD).

The computer program may comprise computer code configured to perform, control or enable the deposition of an electrically conductive polymer onto a flexible substrate of electrically insulating material so that the electrically conductive polymer is retained by the flexible substrate after deposition to form together at least part of an electrode of an electrical storage apparatus in which the electrically conductive polymer provides an electrical path for electrons which are generated and/or stored by the electrical storage apparatus.

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device/server and/or other features of particular mentioned apparatus/device/server may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device/server may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising a flexible substrate of electrically insulating material, an electrically conductive polymer, an electricity-generating elastomer configured to generate electricity in response to applied mechanical strain, and an energy harvesting circuit positioned adjacent to and in contact with the electrically conductive polymer and adjacent to and in contact with the electricity-generating elastomer, wherein the electrically conductive polymer is retained by the flexible substrate to form together at least part of an electrode of an electrical storage apparatus such that the electrically conductive polymer provides an electrical path for electrons which are generated and/or stored by the electrical storage apparatus;
wherein the flexible substrate comprises a plurality of interwoven fibres; and
wherein the flexible substrate is configured to undergo reversible bending and/or reversible stretching.

2. The apparatus of claim 1, wherein the electrically conductive polymer is retained by the flexible substrate by being absorbed into the fibres of the flexible substrate.

3. The apparatus of claim 1, wherein the electrically conductive polymer is retained by the flexible substrate by forming a surface coating on the fibres of the flexible substrate.

4. The apparatus of claim 1, wherein the electrically conductive polymer is retained by the flexible substrate by filling the spaces between the fibres of the flexible substrate.

5. The apparatus of claim 1, wherein the electrically conductive polymer serves as an active material of the electrode.

6. An electrical storage apparatus comprising the apparatus of claim 1, wherein the electrical storage apparatus comprises first and second electrodes, and wherein the apparatus of claim 1 forms at least part of the first electrode.

7. The electrical storage apparatus of claim 6, wherein the electrical storage apparatus is one or more of a battery, a capacitor, and a battery-capacitor hybrid.

8. A device comprising the electrical storage apparatus of claim 6.

9. The device of claim 8, wherein the electrical storage apparatus is configured to store the electricity generated by the electricity-generating elastomer.

10. The device of claim 9, wherein the electricity-generating elastomer is positioned on one or both sides of the electrical storage apparatus.

11. The device of claim 9, wherein the electricity-generating elastomer comprises a dielectric elastomer.

12. The device of claim 8, wherein the device is one or more of an electronic device, a portable electronic device, a portable telecommunications device, and a module for any of the aforementioned devices.

13. An item of clothing comprising the electrical storage apparatus of claim 6.

14. A protective pouch comprising the electrical storage apparatus of claim 6.

15. The protective pouch of claim 14, wherein the protective pouch comprises a first coil configured to couple inductively to a second coil of a device, and wherein the inductive coupling between the first and second coils is configured to enable the transfer of electrical energy generated and/or stored by the electrical storage apparatus to the device.

16. A method comprising depositing an electrically conductive polymer onto a flexible substrate of electrically insulating material comprising a plurality of interwoven fibres so that the electrically conductive polymer is retained by the flexible substrate after deposition to form together at least part of an electrode of an electrical storage apparatus in which the electrically conductive polymer provides an electrical path for electrons which are generated and/or stored by the electrical storage apparatus, depositing an energy harvesting circuit on the electrode adjacent to and in contact with the electrically conductive polymer, and depositing an electricity-generating elastomer configured to generate electricity in response to applied mechanical strain, the electricity-generating elastomer being deposited adjacent to and in contact with the energy harvesting circuit, wherein the flexible substrate is configured to undergo reversible bending and/or reversible stretching.

17. The method of claim 16, wherein depositing the electrically conductive polymer onto the flexible substrate comprises depositing a preformed electrically conductive polymer ink directly onto the flexible substrate.

18. A computer program comprising computer code and being stored on a non-transitory computer readable storage medium which, when the computer code is executed, controls the method of claim 16.

* * * * *